United States Patent
Mukherjee et al.

(10) Patent No.: US 12,322,575 B2
(45) Date of Patent: Jun. 3, 2025

(54) ETCHING PROCESSES AND PROCESSING ASSEMBLIES

(71) Applicant: ASM IP Holding B.V., Almere (NL)

(72) Inventors: Bablu Mukherjee, Nagoya (JP); René Henricus Jozef Vervuurt, Leuven (BE); Takayoshi Tsutsumi, Nagoya (JP); Nobuyoshi Kobayashi, Kawagoe (JP); Masaru Hori, Nissin (JP)

(73) Assignee: ASM IP Holding B.V., Almere (NL)

( * ) Notice: Subject to any disclaimer, the term of this patent is extended or adjusted under 35 U.S.C. 154(b) by 255 days.

(21) Appl. No.: 18/143,652

(22) Filed: May 5, 2023

(65) Prior Publication Data

US 2023/0386792 A1 Nov. 30, 2023

Related U.S. Application Data

(60) Provisional application No. 63/339,561, filed on May 9, 2022.

(51) Int. Cl.
*H01L 21/311* (2006.01)
*H01J 37/32* (2006.01)

(52) U.S. Cl.
CPC .. *H01J 37/32357* (2013.01); *H01L 21/31116* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 4,574,177 A | 3/1986 | Wang | |
| 9,245,793 B2 | 1/2016 | Limdulpaiboon | |
| 9,947,540 B2 | 4/2018 | Tsai | |
| 10,720,334 B2 | 7/2020 | Vervuurt | |
| 2019/0080924 A1* | 3/2019 | Sherpa | H01L 21/0234 |
| 2019/0080925 A1* | 3/2019 | Sherpa | H01L 21/0337 |
| 2020/0013628 A1* | 1/2020 | Chen | H01L 21/67069 |

OTHER PUBLICATIONS

Alfredo Mameli et al., ACS Nano, 11, P9303 (2017).
(Continued)

*Primary Examiner* — Roberts P Culbert
(74) *Attorney, Agent, or Firm* — Laine IP Oy

(57) ABSTRACT

The current disclosure relates to methods of selectively etching material from a first surface of a substrate relative to a second surface of the substrate. The method includes providing the substrate having a first surface comprising an etchable material, and a second surface comprising a non-etchable material in a reaction chamber, providing hydrogen-containing plasma into the reaction chamber to reduce the etchable material to a predetermined depth; and providing remotely-generated reactive halogen species and hydrogen into the reaction chamber to selectively etch the reduced etchable material. The disclosure further relates to methods of selectively etching at least two different etchable materials simultaneously from a surface of a substrate relative to a non-etchable material on the same substrate, to methods of simultaneous differential etching of three or more etchable materials on a substrate, as well as to assemblies for processing semiconductor substrates.

22 Claims, 6 Drawing Sheets

(56) References Cited

OTHER PUBLICATIONS

Jong-Sik Choi et al., ECS Solid State Lett., 2, P114 (2013).
Paul C. Lemaire, and Gregory N Parsons, Thermal Selective Vapor Etching of TiO2: Chemical Vapor Etching via WF6 and Self-Limiting Atomic Layer Etching using WF6 and BCl3, Chem. Mater. 2017, 29, 16, 6653-6665.
Vervuurt, René. H. J.; Mukherjee, Bablu; Nakane, Kazuya; Tsutsumi, Takayoshi; Hori, Masaru; Kobayashi, Nobuyoshi, Reaction Mechanism & Selectivity Control of Si-Compound ALE Based on Plasma Modification and F-radical Exposure, (Ref. Langmuir, Accepted, Oct. 2021).
Younghee Lee and Steven M. George, Thermal Atomic Layer Etching of Titanium Nitride Using Sequential, Self-Limiting Reactions: Oxidation to TiO2 and Fluorination to Volatile TIF4, Chem. Mater. 2017, 29, 8202-8210.

\* cited by examiner

A

B

C

ETCHING PROCESSES AND PROCESSING ASSEMBLIES

CROSS-REFERENCE TO RELATED APPLICATIONS

This application claims the benefit of U.S. Provisional Application No. 63/339,561, filed May 9, 2022, which is incorporated by reference herein in its entirety.

FIELD

The present disclosure relates to etching processes. More particularly, the disclosure relates to methods and systems for selective etching processes that allow differential etching of multiple materials.

BACKGROUND

Dielectric materials, such as silicon oxide, silicon oxycarbide and silicon nitride, are used in semiconductor applications as, for example, interlayer dielectrics of interconnects, diffusion barriers and etch hard masks in semiconducting industry. Similarly, metal oxide materials, such as transition metal oxides have various applications, including use as dielectric materials and etch-stop layers. With shrinking of semiconductor device dimensions, atomic layer etching (ALE) is emerging as a promising process to carefully control the thickness of thin layers needed in the fabrication of such devices. However, the development of controlled etching processes for the above materials is challenging due to the strong reactivity needed from the etchants, such as reactive halogen species. The control of etching rate is especially important for substrates on which multiple materials are present, and only a subset of them need to be etched.

Thus, there is need in the art for further development and fine-tuning of etching processes to enable further scalability and versatility semiconductor device manufacture.

Any discussion, including discussion of problems and solutions, set forth in this section has been included in this disclosure solely for the purpose of providing a context for the present disclosure. Such discussion should not be taken as an admission that any of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of etching dielectric or metallic materials from surfaces of semiconductor substrates. In some embodiments, methods of selectively etching material from a first surface of a substrate relative to a second surface of the substrate are disclosed. Embodiments of the current disclosure further relate to assemblies for processing a substrate.

In an aspect, a method of selectively etching material from a first surface of a substrate relative to a second surface of the substrate is disclosed. The method comprises providing the substrate having a first surface comprising an etchable material, and a second surface comprising a non-etchable material in a reaction chamber, providing hydrogen-containing plasma into the reaction chamber to reduce the etchable material to a predetermined depth, and providing remotely-generated reactive halogen species and hydrogen into the reaction chamber to selectively etch the reduced etchable material. In some embodiments, the reactive halogen species comprise fluorine.

In another aspect, a method of selectively etching at least two different etchable materials simultaneously from a surface of a substrate relative to a non-etchable material on the same substrate is disclosed. The method comprises providing the substrate comprising said materials in a reaction chamber, providing hydrogen-containing plasma into the reaction chamber to reduce the etchable materials to one or more predetermined depths, and providing remotely-generated reactive halogen species and hydrogen into the reaction chamber for selectively etching reduced etchable material. Etchable and non-etchable materials may be on spatially distinct areas. In some embodiments, the first material substantially or completely forms a first surface, whereas the second material substantially or completely forms a second surface.

In yet another aspect, a method of simultaneous differential etching of three or more etchable materials on a substrate is disclosed. The method comprises providing the substrate comprising said materials in a reaction chamber; providing hydrogen-containing plasma into the reaction chamber to reduce two or more of the etchable materials to one or more predetermined depths, and providing remotely generated reactive halogen species and hydrogen into the reaction chamber for selectively etching reduced material from the substrate.

In a further aspect, an assembly for processing a substrate is disclosed. The assembly comprises a reaction chamber constructed and arranged to hold a substrate comprising at least one etchable material, a hydrogen source constructed and arranged to contain and evaporate the hydrogen-containing gas, a first plasma generator in fluid communication with the hydrogen source for generating hydrogen-containing plasma from the hydrogen-containing gas, a halogen reactant source, a second plasma generator in fluid communication with the halogen reactant source for generating halogen-containing plasma from the halogen reactant and a reactant injection system constructed and arranged to provide the hydrogen-containing plasma and the halogen-containing plasma from the first plasma generator and the second plasma generator, respectively, into the reaction chamber. By a plasma generator being in fluid communication with a source is herein meant that the plasma generator and the source are connected to each other in a way that hydrogen or the halogen reactant, respectively, from the source may flow into the plasma generator. In some embodiments, hydrogen-containing plasma is remote plasma. In some embodiments, hydrogen-containing plasma is direct plasma. In some embodiments, halogen-containing plasma is remote plasma.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1:
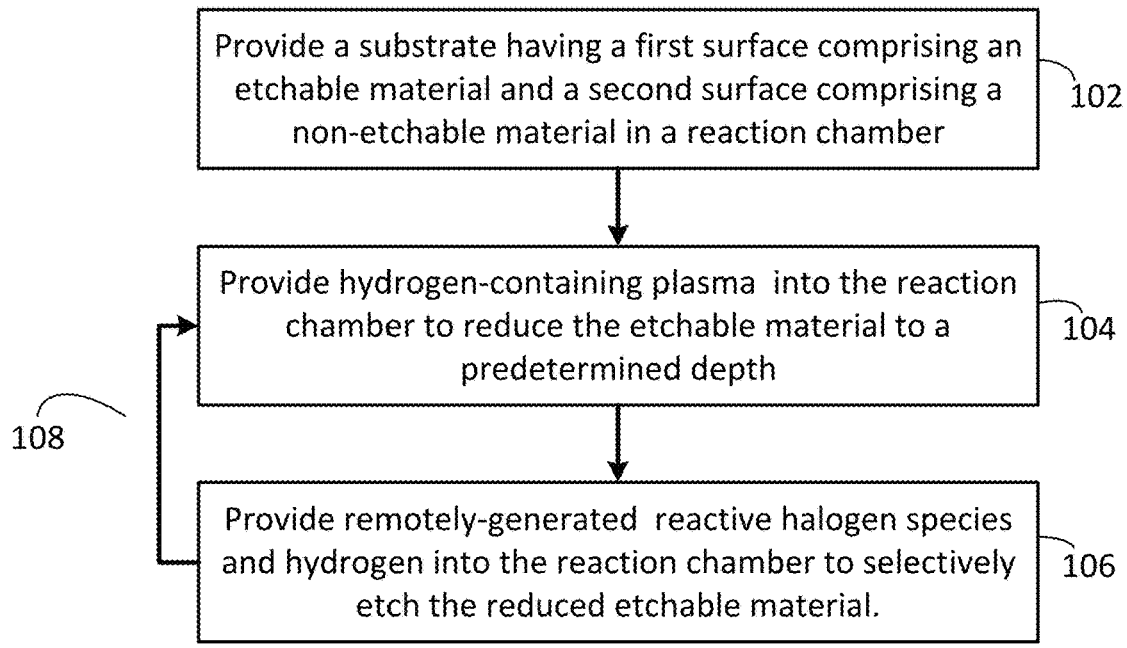
FIG. 1 is a block diagram depicting an exemplary embodiment of a method according to the current disclosure.

The description of exemplary embodiments of methods and assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

General

In an aspect, a method of selectively etching material from a first surface of a substrate relative to a second surface of the substrate is disclosed. In the selective etching process according to the current disclosure, the first surface and the second surface are chemically distinct. That is, the first surface and the second surface differ from each other chemically in a manner that they are distinguishable from each other in the current process. By selectively etching of the first surface relative to the second surface is herein meant that the first surface is etched at a higher rate than the second surface. In some embodiments, both surfaces are etched, but the rate of etching of the first surface is at least two times faster than the rate of etching of the second surface. In some embodiments, the rate of etching of the first surface is at least five times faster than the rate of etching of the second surface. In some embodiments, the rate of etching of the first surface is at least ten times faster than the rate of etching of the second surface rate of etching of the second surface. In embodiments, in which the second surface is etched, but at a lower rate than the first surface, the process may be termed differential etching. However, in some embodiments, the second surface is substantially not etched.

In another aspect, a method of selectively etching at least two different etchable materials simultaneously from a surface of a substrate relative to a non-etchable material on the same substrate is disclosed. By a non-etchable materials is herein meant material that is etched at a significantly lower rate compared to the one or more other materials on the substrate surface. In some embodiments, the at least one non-etchable material is etched at least about three times or at least about five times, or at least about ten times, or at least about twenty times slower than the at least two etchable materials.

In yet another aspect, a method of simultaneous differential etching of three or more etchable materials on a substrate is disclosed. In such embodiments, at least one material may be called a non-etchable material, whereas the other materials may be termed etchable materials. However, in some embodiments, all materials may be considered to be etchable materials, if the difference in their etch rate is not very big. However, even modest differences in etching rate may effectively differentiate the materials, and the surfaces on which they are, from each other. The difference in etching rate may influence the behavior and/or topology of a structure or a device, even in the absence of manyfold etch rate difference.

As used herein, the term substrate may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The etch process according to the current disclosure may be termed atomic layer etching. Atomic layer etching (ALE) is a comparable technique to ALD, in that separated pulses of one or more reactants are utilized. However, rather than depositing material as in ALD, in ALE thin layers of material are controllably etched using sequential reaction steps. In some embodiments the sequential reaction steps are self-limiting. In contrast to conventional continuous etching, ALE typically utilizes a one or more etching cycles to remove material. One or more etching cycles may be provided in an ALE process. Thus, in some embodiments, the selective etching process is a cyclic etching process. An etching cycle comprises providing hydrogen-containing plasma into the reaction chamber, and providing reactive halogen species into the reaction chamber. In some embodiments, an etching cycle may further comprise providing an oxidant, such as oxygen plasma, into the reaction chamber before providing hydrogen-containing plasma into the reaction chamber. The etching cycle may be repeated as many times as deemed suitable for the process in question.

In some embodiments, the selective etching process according to the current disclosure is incorporated into a deposition process. In some embodiments, the etching process is incorporated into a selective deposition process. Thus, a selective etching process according to the current disclosure may be used in combination with one or more selective and/or non-selective deposition process to achieve selective deposition and layer thickness on a substrate.

Selective etching processes according to the current disclosure may be used to remove material from a substrate surface selectively. The material to be etched may be referred to as the etchable material. In some embodiments, the etchable material may be a material comprised in the substrate, or deposited on the substrate. In some embodiments, the etchable material has been deposited on the substrate on purpose. In some applications, different materials with good average optical color contrast in broad-band wavelength range are needed. For example, selective etching may be utilized in patterning, such as spacer-defined double patterning, in which materials—such as $TiO_2$—may be used as resist materials on patterns containing SiN in underlaying layers. The patterned material may be, for example, a carbon-based resist. The deposited $TiO_2$ may be etched anisotropically, revealing the carbon resist, which can also be etched, leaving the side-wall $TiO_2$ as a new pattern having smaller critical density as the original pattern. Thereafter, the underlying SiN material may be selectively etched without etching the $TiO_2$, and after changing the etch conditions, the etch mode can be changed to etch $TiO_2$. Similar approach can be used in forming FinFETs, where, for example, TiN may be conformally deposited on SiN pattern, anisotropically etched to reveal the SiN pattern. Then, etching may be change to favor SiN etching, and the original pattern removed, leaving again the original sidewalls of the conformally deposited TIN. The final devices will then be formed by using gapfill and other methods known in the art.

As another example, methods according to the current disclosure may be utilized in forming flash memory, and particularly in forming floating gate transistors for flash memory. In such embodiments, SiN may be deposited on an unpatterned substrate, TiN is deposited uniformly on the SiN, and the TiN material is patterned without etching the underlying SiN. The patterned TiN may be used as an etch-stop layer in a further etch step, which selectively etches the SiN. The final device is formed through using gapfill and additional patterning steps. In some embodiments, the etchable material may be an unwanted contaminant on the substrate surface. For example, in some embodiments the etchable material to be etched is parasitic material grown unwantedly from an area-selective deposition process.

In some embodiments, the selective etching process according to the current disclosure is a self-limiting process. For example, hydrogen-containing plasma provided into the reaction chamber may reduce the etchable material to a predetermined depth. The reduced material may be more susceptible to the following etchant phase than the non-reduced material. The depth to which the etchable material is reduced, may be regulated through the process conditions of the hydrogen-containing plasma. For example, the depth may depend on plasma ion energy, which may be regulated through adjusting the substrate bias. Also process pressure and temperature may be used in regulating the depth to which the hydrogen-containing plasma reduces the etchable material. The depth of reduction may also be influenced by the properties of the etchable material. This can be influenced already when forming, such as depositing, the etchable material on the surface of the substrate.

The method according to the current disclosure comprises providing the substrate having a first surface comprising an etchable material, and a second surface comprising a non-etchable material in a reaction chamber. In embodiments, in which at least two different etchable materials are etched simultaneously from a surface of a substrate, the method comprises providing the substrate comprising said materials in a reaction chamber.

A reaction chamber is a space for performing the process according to the current disclosure. The reaction chamber may be part of a cluster tool in which different processes are performed to form an integrated circuit. In some embodiments, a flow-type reactor is utilized. In some embodiments, a cross-flow reactor is used. In some embodiments, a showerhead-type reactor is utilized. In some embodiments, the reaction chamber may be a space-divided reactor. In some embodiments, the reaction chamber may be a reaction chamber in a multi-station reactor. In some embodiments, the reaction chamber may be a batch reactor for manufacturing multiple substrates simultaneously.

In the methods according to the current disclosure, hydrogen-containing plasma is provided into the reaction chamber to reduce the etchable material or materials to one or more predetermined depths, and remotely-generated reactive halogen species and hydrogen are provided into the reaction chamber to selectively etch the reduced etchable material from the substrate. The duration of providing hydrogen-containing plasma and/or providing remotely generated reactive halogen species into the reaction chamber may vary according to the specific process conditions. Each of the hydrogen-containing plasma and the remotely generated reactive halogen species may be provided into the reaction chamber ("pulsing time") from about 0.1 seconds (s) to about 120 s, such as from about 0.5 s to about 100 s, or from about 0.5 s to a about 90 s, or from about 0.5 s to about 60 s, or from about 0.5 s to about 30 s, or from about 0.5 s to about 15 s, or from about 0.5 s to about 5 s. The pulsing times may be separate or overlap at least partially, or completely.

Thus, the etching process, and in some embodiments, one etching cycle of a cyclic etching process, comprises two phases. First, the first surface is modified using hydrogen-containing plasma, and the modification phase is followed by an etching phase using reactive halogen species and hydrogen. In some embodiments, the hydrogen-containing plasma comprises substantially only hydrogen and helium. In some embodiments, the hydrogen-containing plasma comprises substantially only hydrogen and argon. In some embodiments, the hydrogen-containing plasma comprises substantially only hydrogen and nitrogen. In some embodiments, the hydrogen-containing plasma comprises substantially only hydrogen, nitrogen and argon. In some embodiments, the hydrogen-containing plasma comprises substantially only hydrogen, helium and argon. In some embodiments, the hydrogen-containing plasma comprises substantially only hydrogen, nitrogen and helium. In some embodiments, the hydrogen-containing plasma does not contain helium or nitrogen. In some embodiments, the hydrogen-containing plasma contains substantially only hydrogen.

In some embodiments, the hydrogen-containing plasma and the reactive halogen species are provided into the reaction chamber alternately and sequentially. In some embodiments, hydrogen is provided into the reaction chamber simultaneously with the reactive halogen species to generate reactive HF species in the reaction chamber. In some embodiments, the reactive halogen species is a reactive fluorine species, and providing reactive fluorine species and hydrogen into the reaction chamber forms reactive HF species in situ. Reactive HF species may comprise HF· and/or reactive HF species with higher vibrational energy. In some embodiments, the in-situ formation of reactive HF species improves the controllability of the etching rate. Without limiting the current disclosure to any specific theory, reactive HF species, such as HF·, may be formed by a reaction of hot gaseous hydrogen with reactive F species present in the reaction chamber. In some embodiments, reactive halogen species is reactive fluorine species, and the reactive fluorine species is formed from SF 6. In some embodiments, reactive halogen species is formed remotely.

In some embodiments, the current selective etching method is used as a part of a vapor deposition process. The deposition process may be selective. In some embodiments, a selective etching process may be carried out at one, two or more intervals in a vapor deposition process. In some embodiments a selective etching step may be carried out following one or more deposition cycles in a cyclic vapor deposition process. For example, a selective etching step may be carried out every nth deposition cycle in a cyclic vapor deposition process like an atomic layer deposition (ALD) process, where n is an integer. In some embodiments a selective etch step may be carried out after every cycle in a cyclic vapor deposition process such as an ALD process.

In some embodiments, the reaction chamber is purged after providing hydrogen-containing plasma and/or after providing reactive halogen species into the reaction chamber. The term "purge" or "purging" may refer to a procedure in which vapor phase reactants and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of reactants, such as hydrogen-containing plasma and/or reactive halogen species provided in the reaction chamber. Purging may avoid or at least reduce gas-phase interactions between gases present in the reaction chamber. It shall be understood that a purge can be effected either in time or in space, or both. For example in the case of temporal purges, a purge can be used e.g. in the temporal sequence of providing a first reactant, such as a hydrogen-containing plasma, into a reactor chamber, providing a purge gas into the reactor chamber, and providing a second reactant, such as reactive halogen species generated from plasma, into the reactor chamber, wherein the substrate on which a layer is deposited does not move. In the case of spatial purge, a purge can take the following form: moving a substrate from a first location to which a first reactant is continually supplied, through a purge gas curtain, to a second location to which a second reactant is continually supplied. Purging times may be, for example, from about 0.01 seconds to about 100 seconds, from about 0.05 s to about 60 s, or from about 1 s to about 100 s, or from about 0.5 s to about 60 s, or between about 1 s and about 60 seconds, such as about 5 s, 10 s, 30 s, 45 s, 70 s or 90 s. For example, in industrial processing tools, the purging time may be in the shorter range of, for example, between about 0.1 s and about 10 s, such as about 0.5 s, about 1 s, about 3 s, about 5 s, about 7 s or about 10 s. However, other purge times can be utilized if necessary, such as where high aspect ratio structures or other structures with complex surface morphology are processed.

In this disclosure, "gas" can include material that is a gas at normal temperature and pressure (NTP), a vaporized solid and/or a vaporized liquid, and can be constituted by a single gas or a mixture of gases, depending on the context. The hydrogen-containing plasma may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The method according to the current disclosure may be performed in different temperatures. By selecting the processing temperature appropriately, it may be possible to choose which materials are etched, and at which rate. In some embodiments, the etching process is performed at a temperature of about 200° C. or below. In some embodiments, the etching process is performed at a temperature of about 100° C. or below. In some embodiments, the etching process is performed at a temperature of about 50° C. or below. In some embodiments, the etching process is performed at a temperature of about 30° C. or below, such as at a temperature of about 25° C. or about 20° C. In some embodiments, the etching process is performed at a temperature of about 50° C. or above. In some embodiments, the etching process is performed at a temperature of about 150° C. or above, such as at a temperature of about 160° C., about 170° C., about 180° C., or about 190° C.

Further, in some embodiments, the etching result may be adjusted by using two different processing temperatures. In some embodiments, three processing temperatures may be used. For example, titanium-containing materials, such as materials comprising titanium nitride or titanium oxide, may need a higher processing temperature than silicon-containing materials. Therefore, initially, both silicon-containing materials, such as silicon nitride, and titanium-containing materials, such as titanium oxide and/or titanium nitride, may be etched. By lowering the processing temperature to below about 40° C., it may be possible to stop the etching of titanium-containing materials, whereas the etching of the silicon-containing material may continue. In some embodiments, the method comprises a heat treatment at the end, to volatilize, for example, any metal halides that may be left on the surfaces that have not been etched, such as $TiF_4$ from the surface of titanium-containing materials. A temperature of about 100° C., about 120° C., about 150° C. or about 160° C. may be used.

In some embodiments, the method comprises providing an oxidant into the reaction chamber before providing the hydrogen-containing plasma into the reaction chamber. In some embodiments, the oxidant comprises oxygen-containing plasma. In some embodiments, the oxidant consists essentially of, or consists of, oxygen plasma. Without limiting the current disclosure to any specific theory, the oxygen-containing plasma may modify different surfaces differently, to alter their responsiveness for the following hydrogen-containing plasma treatment. For example, the topmost part of a silicon nitride surface may be converted to silicon oxide, which is a non-etchable material in the methods according to the current disclosure. Conversely, titanium nitride is not readily etchable by the methods disclosed herein, whereas an oxidant treatment improves its etchability significantly.

Surfaces

In embodiments of the current disclosure, etchable and non-etchable materials are on spatially distinct areas. In some embodiments, the first material substantially or completely forms a first surface, whereas the second material substantially or completely forms a second surface. The substrate may comprise additional surfaces, such as a third surface and a fourth surface, each having a chemically distinct composition, and being an etchable surface or a non-etchable surface. Different etchable surfaces may differ in their rate of etching. The surfaces, such as the first surface, the second surface or one or more further surfaces may each independently be a layer deposited on a substrate. However, they may comprise, consist essentially of, or consist of substrate bulk material. The surfaces may be substantially on the same vertical level, or they can be at different heights relative to the substrate surface.

In the embodiments of the current disclosure, the first surface comprises etchable material. In some embodiments, the substrate comprises at least two surfaces comprising etchable material. For example, the substrate may comprise two surfaces comprising etchable material. In some embodiments, the substrate comprises three surfaces comprising etchable material. In some embodiments, the substrate comprises four surfaces comprising etchable material. In some embodiments, the substrate comprises more than four surfaces comprising etchable material. In embodiments, in which the substrate comprises more than one surface comprising etchable material, the surfaces may be chemically distinct. Thus, the substrate may comprise surfaces having different composition, and each of them may be etchable. In some embodiments, the etching rate of the two or more etchable surfaces subjected to the processes according to the current disclosure differs. Thus, the methods disclosed herein may allow differential etching of multiple surfaces present on the same substrate. In some embodiments, the rate of etching of the different etchable materials is different. In some embodiments, at least one etchable surface, such as the first surface, comprises, consists essentially of, or consists of, a silicon-containing material.

In some embodiments, the first surface (i.e. material of the first surface) comprises oxygen. In some embodiments, the first surface comprises an oxide. In some embodiments, the first surface consists substantially of or consists of an oxide. In some embodiments, the oxide is a metal oxide. Many metals may form oxides in various oxidation states, and the term oxide as used herein encompasses all suitable oxidation states. In some embodiments, the metal oxide is a transition metal oxide. In some embodiments, the transition metal oxide is selected from a group consisting of titanium oxide, molybdenum oxide, tungsten oxide, tantalum oxide and vanadium oxide. In some embodiments, the oxide, such as a metal oxide or a transition metal oxide, is the etchable material.

In some embodiments, the substrate comprises two different etchable surfaces, and both of the surfaces comprise an oxide. In some embodiments, the substrate comprises three different etchable surfaces, and all of them comprise an oxide. In some embodiments, the substrate comprises two, three or four different etchable oxide surfaces, and the oxides are independently selected from a group consisting of titanium oxide, molybdenum oxide, tungsten oxide, tantalum oxide and vanadium oxide. In some embodiments, the substrate comprises four or more different etchable surfaces, and all of them comprise an oxide. In some embodiments, the substrate may comprise titanium oxide and molybdenum oxide. In some embodiments, the substrate may comprise titanium oxide and molybdenum oxide. In some embodiments, the substrate may comprise titanium oxide and tungsten oxide. In some embodiments, the substrate may comprise titanium oxide and tantalum oxide. In some embodiments, the substrate may comprise titanium oxide and vanadium oxide.

The substrate according to the current disclosure may comprise a non-etchable surface. A non-etchable surface is substantially not etched by the methods disclosed herein. There may be more than one non-etchable surface on the substrate. In some embodiments, the non-etchable surface comprises silicon. In some embodiments, the non-etchable surface, such as the second surface comprises an oxide. In some embodiments, the second surface comprises silicon and oxygen. In some embodiments, the second surface comprises, consists essentially of, or consists of, silicon oxide (such as $SiO_2$). In some embodiments, the second surface consists essentially of silicon oxide and is a non-etchable surface. It may include other elements such as nitrogen, carbon, hydrogen, etc. and impurities to the extent that such elements do not materially change the characteristics of silicon oxide. The non-etchable surface, such as the second surface, may comprise doped silicon oxide, such as boron-doped silicon oxide or phosphorus-doped silicon oxide. In some embodiments, the second surface comprises silicon, carbon and oxygen. In some embodiments, the second surface consists essentially of, or consists of silicon, oxygen and carbon. In some embodiments, the second surface comprises, consists essentially of, or consists of, silicon oxycarbide. In some embodiments, the second surface comprises a silicon oxycarbide and is an etchable surface having a slower etching rate than the first surface.

In some embodiments, the etchable surface, such as the first surface comprises, consists essentially of, or consists of silicon oxycarbide (SiOC).

In some embodiments, the etchable surface, such as the first surface, comprises nitrogen. In some embodiments, the etchable surface comprises, consists essentially of, or consists of, a nitride. In some embodiments, the one or more etchable materials comprises, consists essentially of, or consists of, a nitride. In some embodiments, the substrate comprises two different etchable surfaces, and both of the surfaces comprise a nitride. In some embodiments, the substrate comprises three different etchable surfaces, and all of them comprise a nitride. In some embodiments, the substrate comprises two, three or four different etchable nitride surfaces, and the nitrides are independently selected from a group consisting of silicon nitride, titanium nitride, molybdenum nitride, tungsten nitride, tantalum nitride and vanadium nitride. In some embodiments, the substrate comprises four or more different etchable surfaces, and all of them comprise a nitride.

In some embodiments, the substrate comprises two, three or four different etchable carbide surfaces, and the carbides are independently selected from a group consisting of silicon carbide, titanium carbide, molybdenum carbide, tungsten carbide, tantalum carbide and vanadium carbide. In some embodiments, the substrate comprises four or more different etchable surfaces, and all of them comprise a carbide.

In some embodiments, the second surface, which, in certain embodiments, can be a non-etchable surface, comprises nitrogen. In some embodiments, the second surface comprises nitrogen and hydrogen. In some embodiments, the second surface comprises, consists essentially of, or consists of silicon nitride. In this disclosure, silicon nitride is a material characterized or recognized as silicon nitride which may include other elements such as oxygen, carbon, hydrogen, etc. and impurities to the extent that such elements do not materially change the characteristics of the silicon nitride. In some embodiments, the second surface comprises, consists essentially of, or consists of, SiCN. In some embodiments, the second surface comprises, consists essentially of, or consists of SiNO. In some embodiments, the second surface comprises, consists essentially of, or consists of SiNCO. The material indications SiCN, SiNO, SiNCO are commonly accepted abbreviations in the art, indicating merely the layer types (indicating simply by primary constituent elements), in a non-stoichiometric manner unless described otherwise. In some embodiments, the second surface is not a metal oxide surface. In some embodiments, the second surface is not a semimetal oxide surface. In some embodiments, the second surface does substantially not comprise carbon. In some embodiments, the second surface does substantially not comprise oxide.

In some embodiments, the substrate comprises two or more different etchable surfaces. Thus, the substrate may comprise a third surface comprising, consisting essentially of, or consisting of, a third material. The hydrogen-containing plasma may reduce the third material to a different depth relative to the first surface and the second surface. In some embodiments, the etch rate of the reduced third material is different from the etch rate of the other etchable materials. In some embodiments, the substrate comprises a fourth or a further surface comprising a fourth or a further material.

In some embodiments, the second etchable material is selected from a group consisting of oxides, nitrides, carbides, oxycarbides and carbonitrides. In some embodiments, and at least one of the two or more etchable surfaces is a nitride surface, and at least one of them is an oxide surface. In some embodiments, one etchable surface comprises, consists essentially of, or consists of, silicon nitride and one etchable surface comprises, consists essentially of, or consists of, titanium oxide. In some embodiments, one etchable surface comprises, consists essentially of, or consists of, titanium nitride and one etchable surface comprises, consists essentially of, or consists of, titanium oxide. In some embodiments, one etchable surface comprises, consists essentially of, or consists of, silicon carbonitride and one etchable surface comprises, consists essentially of, or consists of, titanium oxide. In some embodiments, one etchable surface comprises, consists essentially of, or consists of, silicon nitride and one etchable surface comprises, consists essentially of, or consists of, a transition metal oxide, such as titanium oxide, vanadium oxide, tungsten oxide, tantalum oxide or molybdenum oxide. In some embodiments, the etchable material comprises a material selected from a group comprising of titanium oxide, titanium nitride, silicon carbonitride and silicon nitride. In some embodiments, the substrate comprises or three or more different etchable surfaces. In some embodiments, the three or more different etchable surfaces may be selected from a group consisting of transition metal oxides, transition metal nitrides, silicon nitride, silicon oxynitride, silicon carbide, silicon oxycarbide and silicon carbonitride.

In some embodiments, the substrate comprises a non-etchable surface. In some embodiments, the non-etchable surface is the second surface. Thus, in some embodiments, the second surface of the substrate comprises, consists essentially of, or consists of non-etchable material. In some embodiments, however, the substrate comprises two or more non-etchable surfaces having distinct chemical properties. Depending on the processing conditions, such as temperature, or specific process steps, such as providing an oxidant into the reaction chamber before providing the hydrogen-containing plasma into the reaction chamber. Thus, in some contexts, a given material, such as silicon nitride, may be an etchable and in some others, a non-etchable material. Thus, the second surface may have variable composition, depending on the composition and etch sensitivity of the first surface.

In some embodiments, the second surface comprises material that is etched at a slower rate by the current processes relative to the first surface.

In some embodiments, the non-etchable surface, such as the second surface, comprises nitrogen. In some embodiments, the non-etchable surface, such as the second surface, comprises a nitride, such as silicon nitride or titanium nitride. In some embodiments, the non-etchable surface, such as the second surface, comprises a metal nitride, such as a transition metal nitride. In some embodiments, the non-etchable surface, such as the second surface, comprises silicon. In some embodiments, the non-etchable surface, such as the second surface, comprises oxygen. In some embodiments, the non-etchable surface, such as the second surface, does not comprise oxygen. In some embodiments, the non-etchable surface, such as the second surface, comprises a material selected from a group consisting of titanium oxide, titanium nitride and silicon oxide. In some embodiments, the non-etchable surface, such as the second surface, comprises, consists essentially of, or consists of, silicon oxide.

In the methods according to the current disclosure, plasma is used to generate reactive species in the reaction chamber, such as hydrogen-containing plasma and reactive halogen species. The reactive species can be generated from RF-generated plasma. The reactive halogen species can be generated from, for example, inductively coupled plasma (ICP) or capacitively coupled plasma (CCP). In some embodiments, reactive halogen species are generated by a microwave plasma source. Reactive halogen species according to the current disclosure may comprise ions, radicals or both. In some embodiments, reactive halogen species comprise or consist essentially of HF· and/or reactive HF species with higher vibrational energy. In some embodiments, the reactive halogen species comprises, consists essentially or consists of HF· radicals.

In some embodiments, the oxygen-containing plasma is RF-generated CCP plasma from $O_2$. In some embodiments, the hydrogen-containing plasma is RF-generated CCP plasma from $H_2$. In some embodiments, the reactive halogen species is generated by microwave plasma source. In some embodiments, the reactive halogen species are reactive HF species, such as HF· radicals, generated from $SF_6$ microwave plasma. In some embodiments, the reactive halogen species, such as fluorine radicals, are generated simultaneously with providing gaseous hydrogen ($H_2$) into the reaction chamber. The fluorine radicals may react with the gaseous hydrogen to generate reactive HF species, such as HF· radicals, in the reaction chamber.

In some embodiments, reactive halogen species are generated from a gas containing fluorine. In some embodiments, reactive halogen species are generated from a gas containing $SF_6$. In some embodiments, reactive halogen species are generated from a gas containing substantially only $SF_6$ and $H_2$. In some embodiments, the reactive halogen species are fluorine radicals.

Plasma power of RF-generated plasma, such as hydrogen plasma or oxygen plasma, can be varied in different embodiments of the current disclosure. In some embodiments, plasma is generated by applying RF power of from about 10 W to about 500 W, or from about 20 W to about 500 W, or from about 40 W to about 500 W, such as about 50 W, about 60 W or about 70 W.

In some embodiments the RF power density may be from about 0.02 W/cm$^2$ to about 2.0 W/cm$^2$, or from about 0.05 W/cm$^2$ to about 1.5 W/cm$^2$. The RF power may be applied to a gas that flows during the plasma pulse time, that flows continuously through the reaction chamber, and/or that flows through a remote plasma generator. Thus, in some embodiments, radical species may be formed remotely via plasma discharge ("remote plasma") away from the substrate or reaction space. In some embodiments, radical species may be formed in the vicinity of the substrate or directly above substrate ("direct plasma"). Direct plasma may be CCP plasma. In some embodiments, plasma power is 50 W.

Microwave plasma may be generated as known in the art, for example, having a frequency of 2.45 GHz and power 50 W. The intensity of reactive HF species generation depends also on the flow rate of the fluorine source compound (such as SF 6), which may be, for example, from about 10 sccm to about 500 sccm, and on the pressure in the reaction chamber during plasma generation, which may be, for example from about 0.01 Torr to about 1 Torr, or from about 0.01 Torr to about 10 Torr.

In some embodiments, methods according to the current disclosure comprise one or more etching cycles. The method may comprise at least one etching cycle at a different temperature than the one or more other etching cycles. The method may comprise at least one etching cycle at a different pressure than the one or more other etching cycles. In some embodiments, two different temperatures are used during a cyclic etching process. In some embodiments, two different pressures are used during a cyclic etching process. By changing a temperature and/or pressure between etching cycles, it may be possible to influence the etch rate and/or etch selectivity between materials.

Each etching cycle may comprise providing a hydrogen-containing plasma into the reaction chamber and providing radical species generated by plasma into the reaction chamber. An etching cycle may comprise removing excess reactant and/or reaction byproducts, if any, from the reaction chamber. Said removal may be performed as a purge. In some embodiments the etching cycle is repeated two or more times. In some embodiments, the etching cycle is repeated immediately after the previous cycle has been completed, i.e. there are no additional process steps between the two etching cycles.

Without limiting the current disclosure to any specific theory, the hydrogen-containing plasma may reduce certain materials more readily than other materials. In some embodiments, it may be possible to regulate the depth of the reduction of a surface by adjusting the length of the time hydrogen-containing plasma is present in the reaction chamber, i.e. the pulse time of the hydrogen-containing plasma.

In some embodiments, the substrate may comprise three-dimensional structures, such as fins and/or gaps. The etching processes described herein may be utilize for etching material from a first surface of a substrate relative to a second surface of the substrate also on such substrates. The etching according to the current disclosure may be isotropic etching or anisotropic etching, depending on the processing conditions. Without limiting the current disclosure to any specific theory, using conditions with higher plasma energy may promote anisotropic etching, in which the horizontal surfaces of the structures are preferentially etched. Thus, higher ion energy, such as about 25 to about 30 eV may lead to topo-selective etching, in which the top and bottom horizontal surfaces are etched at a higher rate relative to side walls of the structures. In some embodiments, the side walls of a structure may be substantially or fully perpendicular relative to the horizontal surfaces of the substrate, whereas in some embodiments, the side walls may be slanted.

The current disclosure further relates to an assembly for processing a substrate. The processing assembly comprises a reaction chamber constructed and arranged to hold a substrate comprising at least one etchable material, a hydrogen source constructed and arranged to contain the hydrogen-containing gas, a first plasma generator in fluid communication with the hydrogen source for generating hydrogen-containing plasma from the hydrogen-containing gas, a halogen reactant source, a second plasma generator in fluid communication with the halogen reactant sources for generating halogen-containing plasma from the halogen reactant and a reactant injection system constructed and arranged to provide the hydrogen-containing plasma and the halogen-containing plasma from the first plasma generator and the second plasma generator, respectively, into the reaction chamber.

In some embodiments, the reaction chamber is an etching chamber constructed and arranged to vapor-phase etching of a semiconductor substrate. In some embodiments, the first plasma generator is constructed and arranged to generate capacitively coupled plasma. In some embodiments, the second plasma generator is a microwave plasma generator.

DRAWINGS

The disclosure is further explained by the following exemplary embodiments depicted in the drawings. The illustrations presented herein are not meant to be actual views of any particular material, structure, or assembly, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. Specifically, relative etch rates of different materials indicated in the drawings may deviate from the experimental results, the specifics of which may vary according to process conditions. The structures and devices depicted in the drawings may contain additional elements and details, which may be omitted for clarity.

FIG. 1 illustrates an exemplary embodiment of a selective etching method 100 according to the current disclosure as a block diagram. Method 100 may be used to selectively etch a first material relative to a second material from a substrate. The etching method 100 can be used during a formation of a semiconductor structure or device.

During block 102, a substrate is provided into a reaction chamber of a substrate processing apparatus. The reaction chamber can form part of cluster tool. In some embodiments, the substrate processing apparatus is a single-wafer processing apparatus. Alternatively, the apparatus may be a batch processing apparatus. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing phases of the structure or device are performed in additional reaction chambers of the same cluster tool. In some embodiments, the reaction chamber is a deposition station of a multi-station chamber. The reaction chamber can be provided with a heater to activate the reactions by elevating the temperature of one or more of the substrate and/or the reactants and/or other gases.

During block 102, the substrate can be brought to a desired temperature and pressure for providing hydrogen-containing plasma into the reaction chamber (block 104) and/or for providing remotely generated reactive halogen species and hydrogen into the reaction chamber (block 106). A temperature (e.g. of a substrate or a substrate support) within a reaction chamber can be, for example, from about 20° C. to about 220° C., from about 20° C. to about 180° C., from about 20° C. to about 150° C. or from about 20° C. to about 100° C. As a further example, a temperature within a reaction chamber can be from about 20° C. to about ° C., or from about 20° C. to about 30° C., or from about 30° C. to about 80° C. Exemplary temperatures within the reaction chamber may be 20° C., 25° C., 30° C., 50° C., 80° C., 160° C., 170° C., 180° C. or 190° C.

A pressure within the reaction chamber can be less than 760 Torr, for example less than 100 Torr, less than 50 Torr, less than 10 Torr, less than 5 Torr, less than 2 Torr, less than 1 Torr, less than 0.1 Torr or less than 0.05 Torr. In some embodiments, a pressure within the reaction chamber is from about 0.01 Torr to about 80 Torr, or from about 0.01 Torr to about Torr, or from about 0.01 Torr to about 1 Torr, or from about 0.01 Torr to about 0.1 Torr, or from about 0.01 Torr to about 0.05 Torr. Exemplary reaction chamber pressures include about Torr, about 15 Torr, about 10 Torr, about 5 Torr, 1.5 Torr, about 0.1 Torr, about 0.5 Torr or about 0.03 Torr. Different pressure may be used for different process steps. In some embodiments, the pressure is the same throughout the process.

Hydrogen-containing plasma is provided into the reaction chamber containing the substrate at block 104 to reduce the etchable material to a predetermined depth. Without limiting the current disclosure to any specific theory, the hydrogen-containing plasma may have a different effect on different surfaces, and the modifications brought about by exposing the substrate to hydrogen-containing plasma at block 104 may differ on different surfaces.

The duration of providing hydrogen-containing plasma into the reaction chamber (hydrogen-containing plasma pulse time) may be, for example, from about 0.5 seconds to about 10 minutes. The duration of providing hydrogen-containing plasma into the reaction chamber is selected based on the process, tool and other factors. In some embodiments, duration of providing hydrogen-containing plasma into the reaction chamber is from about seconds to about 5 minutes, or from about 0.5 seconds to about 3 minutes, or from about seconds to about 2 minutes or from about 0.5 seconds to about 1 minute, or from about seconds to about 30 seconds. In some embodiments, duration of providing hydrogen-containing plasma into the reaction chamber is shorter than about 5 minutes, or shorter than about 1 minute. In some embodiments, the duration of providing hydrogen-containing plasma into the reaction chamber (hydrogen-containing plasma pulse time) is may be longer than about 0.5 seconds or longer than about 1 second or longer than about 10 seconds, or longer than about 20 seconds.

The reaction chamber may be purged after hydrogen-containing plasma has been provided therein (not depicted in FIG. 1). In some embodiments, purge time after hydrogen-containing plasma pulse may be from about 0.1 seconds to about 5 minutes, or from about second to about 3 minutes, or from about 0.5 seconds to about 2 minutes, or from about seconds to about 60 s, or from about 0.5 seconds to about 20 s, or from about 1 second to about 15 s. In some embodiments, the purge time after hydrogen-containing plasma is shorter than 60 seconds, shorter than 30 seconds or shorter than 10 seconds. In some embodiments, purging the reaction chamber is used to cool down the substrate. Without limiting the current disclosure to any specific theory, the substrate temperature may increase during the plasma treatment. The temperature increase may be, for example, more than about 10° C., more than about 25° C., more than about 50° C., or more than about 70° C. The purge time needed to suitably reduce the substrate temperature may depend on process specifics, and the appropriate time can be adjusted accordingly.

Remotely generated reactive halogen species and gaseous hydrogen are provided into the reaction chamber at block 106. The reactive halogen species may etch the material of the surface, such as the first surface, reduced by the hydrogen-containing plasma of block 104. The duration of providing remotely generated reactive halogen species into the reaction chamber (reactive halogen pulse time) may be, for example from about 0.5 seconds to about minutes, or from about 0.5 seconds to about 3 minutes, or from about 0.5 seconds to about 1 minute, or from about 0.5 seconds to about 90 seconds, or from about 0.5 seconds to about seconds. In some embodiments, a reactive halogen pulse time is from about 2 seconds to about 5 minutes, or from about 5 seconds to about 3 minutes, or from about 5 seconds to about 60 seconds, or from about 5 second to about 30 seconds. In some embodiments, the plasma pulse time is about 3 seconds, about 10 seconds, about 20 seconds, about 45 seconds, about 60 seconds, about 90 seconds, about 120 seconds or about 150 seconds. In some embodiments, the duration of providing reactive halogen species from plasma into the reaction chamber is shorter than about 120 seconds, shorter than about 90 seconds, shorter than about 60 seconds, or shorter than about 30 seconds. Conversely, in some embodiments, a minimum duration for the plasma pulse may be defined. For example, the plasma pulse time may be longer than about 120 seconds, longer than about 60 seconds, longer than about 45 seconds, longer than about 20 seconds, longer than about 5 seconds, or longer than about 0.5 seconds.

The reaction chamber may be purged after phase 106 (not depicted in FIG. 1). The purging may be performed substantially as described above, with exemplary durations of from about 10 seconds to about 180 seconds. A low pressure of less than 0.01 Torr may be used in some embodiments. Purging after etching may have the advantage of removing any reactive halogen species from the reaction chamber that may negatively influence the process if present at the beginning of the next etching cycle.

In some embodiments, a process gas, such as hydrogen for providing hydrogen-containing plasma, or SF 6 for providing reactive halogen species, is turned on before the plasma is ignited. Thus, the duration of process gas flow may be longer than the times indicated above.

Blocks 104 and 106, may form an etching cycle, resulting in etching material of the first surface. In some embodiments, the two blocks of selective etching according to the current disclosure, namely providing the hydrogen-containing plasma and reactive halogen species generated from plasma and gaseous hydrogen (104 and 106), may be repeated (loop 108). Such embodiments contain several etching cycles. The amount of material etched from the first surface may be regulated by adjusting the number of etching cycles and/or parameters during etching. The etching cycle (loop 108) may be repeated until a desired amount of material is etched. For example, one, two, three, four, five or more etching cycles may be performed. In some embodiments, about 10 or about 20 etching cycles may be performed.

The amount of material etched during one etching cycle varies depending on the material and process conditions, such as the hydrogen-containing plasma, ion energy and processing temperature and reactive halogen pulse duration. In some embodiments, material is removed from the first surface at a rate of about 0.5 Å/cycle to about 25 Å/cycle. In some embodiments, etching rate of the material from the first surface may be, for example, from about 2 Å/cycle to about 15 Å/cycle, whereas in some other embodiments, the etching rate may be, for example from about 3 Å/cycle to about 20 Å/cycle, or from about 3 Å/cycle to about 15 Å/cycle. For example, the etch rate may be about 2 Å/cycle, or about 6 Å/cycle, or about 8 Å/cycle, or about 12 Å/cycle. Depending on the etching conditions, etching cycle numbers etc., variable depth of material may be removed by etching. The desired etching depth achieved by the method according to the current disclosure may be selected based on the application in question.

For example, at a temperature of 180° C., using CCP hydrogen plasma as the hydrogen-containing plasma, and $SF_6$ with gaseous hydrogen in for etching, titanium nitride is etched at a rate of about 5.8 Å/cycle, whereas titanium oxide is etched at a rate of about 1.3 Å/cycle. Thus, in some embodiments, titanium oxide is etched about twice as fast as titanium nitride. Therefore, in some embodiments, titanium oxide may form the first surface and titanium nitride the second surface.

Figure 2:
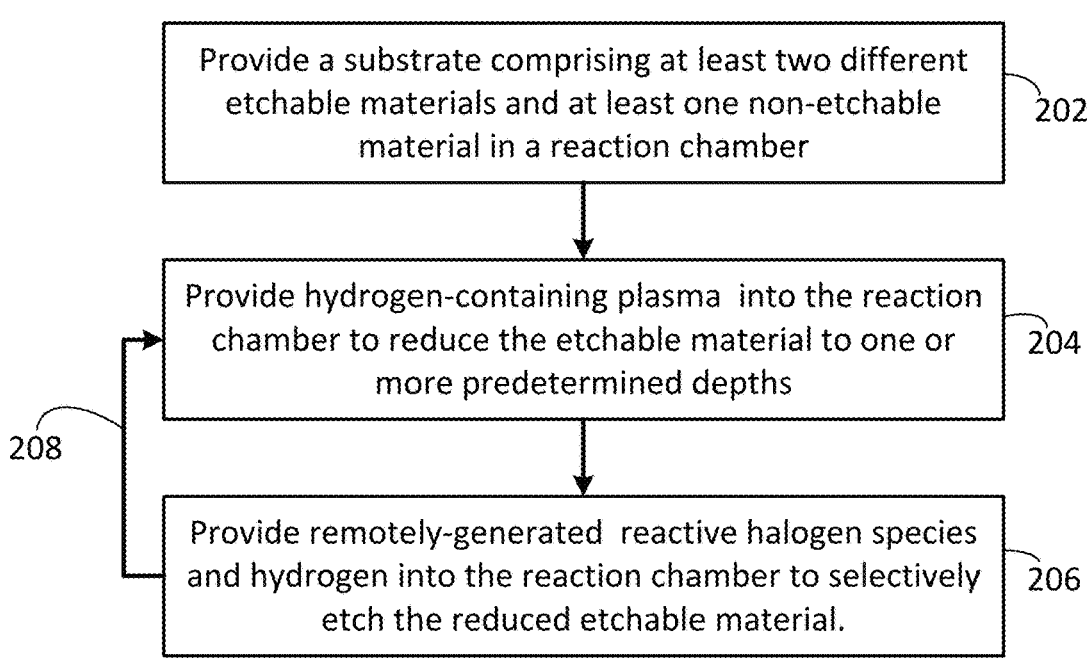
FIG. 2 is a block diagram depicting another exemplary embodiment of a method according to the current disclosure.

FIG. 2 depicts a method 200 of etching at least two different etchable materials on a substrate that additionally comprises at least one non-etchable material. The two etchable materials may be etched at different rates. At block 202, a substrate is provided into a reaction chamber of a substrate processing apparatus. The reaction chamber and the corresponding semiconductor processing apparatus may be as described above.

At block 202, the substrate can be brought to a desired temperature and pressure for providing hydrogen-containing plasma into the reaction chamber (block 204) and/or for providing remotely generated reactive halogen species and hydrogen into the reaction chamber (block 206). Temperature and pressure parameters may be selected as above. The process may comprise multiple etching cycles 208, as explained above for FIG. 1. The method may comprise at least one etching cycle at a different temperature than the one or more other etching cycles. For example, at least one etching cycle may be performed at a temperature above 150° C., such as at a temperature of about 160° C., about 180° C. or about 200° C., and at least one etching cycle may be performed at a temperature below 40° C., such as at a temperature of about 35° C., about 25° C. or about 20° C. The method may comprise at least one etching cycle at a different pressure than the one or more other etching cycles. For example, at least one etching cycle may be performed at a pressure above 5 Torr, such as at a pressure of about 6 Torr, about 10 Torr or about 20 Torr, and at least one etching cycle may be performed at a pressure below 5 Torr, such as at a pressure of about 3 Torr, about 1 Torr or about 0.1 Torr. By changing a temperature and/or pressure between etching cycles, it may be possible to influence the etch rate and/or etch selectivity between materials.

At block 204, hydrogen-containing plasma is provided into the reaction chamber to reduce the etchable material to a predetermined depth. As above, the hydrogen-containing plasma may have a different effect on different surfaces, and the modifications brought about by exposing the substrate to hydrogen-containing plasma at block 204 may differ on different surfaces, and the duration of providing hydrogen-containing plasma into the reaction chamber may vary, depending on the application and other process parameters. The reaction chamber may be purged after hydrogen-containing plasma has been provided therein (not depicted in FIG. 2).

Remotely generated reactive halogen species and gaseous hydrogen are provided into the reaction chamber at block 206. The reactive halogen species may etch the at least two etchable materials of the surface relative to the non-etchable material. The duration of providing remotely generated reactive halogen species into the reaction chamber varies as indicated for FIG. 1, and the reaction chamber may be purged after phase 206.

Blocks 204 and 206, may form an etching cycle, again indicated by the loop 208. Such embodiments contain several etching cycles.

The etching processes according to the current disclosure were tested in multiple experiments, and some results are summarized in Table 1 and Table 2 below.

TABLE 1

Etch selectivity and the effect of oxygen plasma on the etching of various materials.

| Material | $O_2$ plasma + 6 etching cycles: Thickness etched [nm] | 6 etching cycles (no $O_2$ plasma) Thickness etched [nm] |
|---|---|---|
| TiN | 7.58 nm | 3.48 nm |
| $TiO_2$ | 12.01 nm | 8.87 nm |
| SiN | −0.14 nm | 4.85 nm |
| $SiO_2$ | −0.33 nm | −0.68 nm |

Table 1 summarizes the etching achieved by 6 etching cycles on different materials. All etching tests were performed at an elevated temperature of about 180° C. The initial thicknesses of the tested materials were about 17 nm for TiN, about 40 nm for $TiO_2$, about 35 nm for SiN and about 21 nm for $SiO_2$. Without oxygen plasma treatment, all materials except $SiO_2$ were etched. $TiO_2$ was etched the most (about 9 nm), SiN and TiN less (about 5 nm and about 3.5 nm, respectively).

When the same materials were first treated with oxygen plasma, both $SiO_2$ and SiN were not etched, whereas both titanium-based materials were etched, and the amount of etched material increased, indicating an increase in etching efficiency.

TABLE 2

Etching rates of various materials at different temperatures.

| Material | Etching rate [nm/cycle], 170° C. | Etching rate [nm/cycle], RT |
|---|---|---|
| $TiO_2$ | 1.47 | ~0 |
| TiN | 0.58 | ~0 |
| SiN | 0.74 | 0.8 |
| SiCN | 2.1 | 1.63 |
| $SiO_2$ | ~0 | ~0 |

Table 2 depicts the rate of etching per etch cycle for five different materials at high (170° C.) and low (RT) temperatures, respectively. Again, under all tested conditions, $SiO_2$ was not etched, whereas the tested titanium-based materials $TiO_2$ and TiN were etched only in high temperature. The etch rate of TiN was about third of the etch rate of $TiO_2$ (0.58 nm/cycle vs. 1.47 nm/cycle). Temperature had no major effect on the etching rate of SiN, as it was etched about at a rate of 0.8 nm/cycle at both temperatures. SiCN was etched fastest of the tested materials at both temperatures, and its etching rate was slightly faster at high temperature, as the etching rate increased from about 1.6 nm/cycle for RT to about 2 nm/cycle at 170° C.

Figure 3:
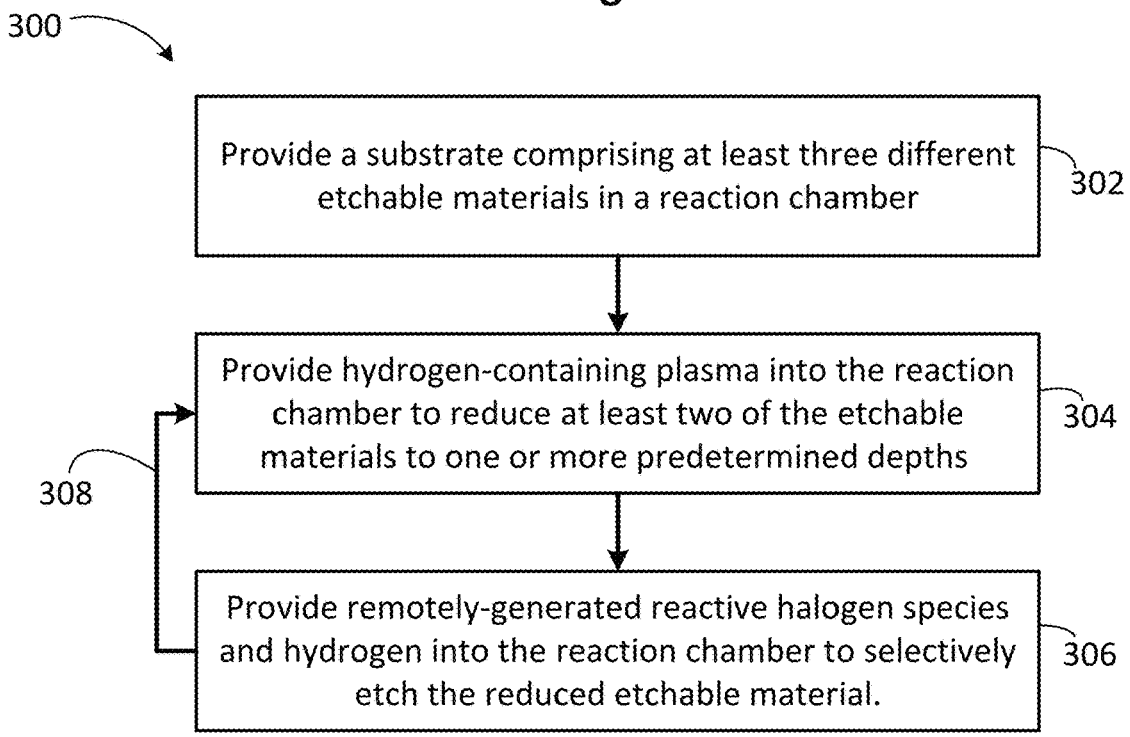
FIG. 3 is a block diagram depicting yet another exemplary embodiment of a method according to the current disclosure.

FIG. 3 depicts a method 300 of etching at least three different etchable materials on a substrate. The at least three etchable materials may be etched at different rates and under different etching conditions. At block 302, a substrate is provided into a reaction chamber of a substrate processing apparatus. The reaction chamber and the corresponding semiconductor processing apparatus may be as described above.

At block 302, the substrate can be brought to a desired temperature and pressure for providing hydrogen-containing plasma into the reaction chamber (block 304) and/or for providing remotely generated reactive halogen species and hydrogen into the reaction chamber (block 306). Temperature and pressure parameters may be selected as above. The process may comprise multiple etching cycles 308, as explained for FIGS. 1 and 2. The method may comprise at least one etching cycle at a different temperature than the one or more other etching cycles. For example, at least one etching cycle may be performed at a temperature above 150° C., such as at a temperature of about 160° C., about 180° C. or about 200° C., and at least one etching cycle may be performed at a temperature below 40° C., such as at a temperature of about 35° C., about 25° C. or about 20° C. The method may comprise at least one etching cycle at a different pressure than the one or more other etching cycles. For example, at least one etching cycle may be performed at a pressure above 5 Torr, such as at a pressure of about 6 Torr, about 10 Torr or about 20 Torr, and at least one etching cycle may be performed at a pressure below 5 Torr, such as at a pressure of about 3 Torr, about 1 Torr or about 0.1 Torr. By changing a temperature and/or pressure between etching cycles, it may be possible to influence the etch rate and/or etch selectivity between materials.

At block 304, hydrogen-containing plasma is provided into the reaction chamber to reduce at least two of the etchable materials to a predetermined depth. In some embodiments, all of the ate least three different etchable materials are reduced. As above, the hydrogen-containing plasma may have a different effect on different surfaces, and the modifications brought about by exposing the substrate to hydrogen-containing plasma at block 304 may differ on different surfaces. The duration of providing hydrogen-containing plasma into the reaction chamber may vary, depending on the application and other process parameters. The reaction chamber may be purged after hydrogen-containing plasma has been provided therein (not depicted in FIG. 3).

Remotely generated reactive halogen species and gaseous hydrogen are provided into the reaction chamber at block 306. The reactive halogen species may etch the at least two of the etchable materials of the surface. In some embodiments, reactive halogen species etch all of the at least three etchable materials of the surface. The duration of providing remotely generated reactive halogen species into the reaction chamber varies as indicated for FIGS. 1 and 2, and the reaction chamber may be purged after phase 306.

FIGS. 4 to 7 present examples of etching schemes according to the current disclosure in schematic form. The two phases of providing a hydrogen-containing plasma and providing remotely generated reactive halogen species have been omitted from all of FIGS. 4 to 7. They are explained in connection which each presented embodiment. In the embodiments of FIGS. 4 to 7, the different materials on the surface are depicted schematically as a side view, having the same area, thickness and having their surfaces in one plane in the beginning of the method according to the current disclosure (denoted by a) in the figures). However, in reality, the substrate may have one or more underlying material layers under the ones shown in the figures. Therefore, in addition to having different thickness, the material layers may be on different elevations relative to the overall substrate surface. Thus the surfaces of the material layers may be on different levels. They may have different widths and surface areas, depending on the structures and devices that have been or are being formed on the substrate.

In the embodiments of FIGS. 4 to 7, the surface comprises five different materials as examples of the functioning of the current process, titanium oxide ($TiO_2$), titanium nitride (TiN), silicon nitride (SiN), silicon carbonitride (SiCN) and silicon oxide ($SiO_2$). Further, silicon carbide (SiC) and oxycarbide (SiOC), and titanium carbide may also be etched by the methods disclosed herein. The methods according to the current disclosures may be used to selectively etch the exemplary materials in different ways, as described in connection with each illustrated embodiment.

Generally, $TiO_2$ is etched fastest of the studied materials, whereas nitrides, TiN and SiN, are etched slowly, and $SiO_2$ is substantially not etched. Further, of the silicon-comprising materials, SiC is etched faster than SiCN, which is etched faster than SiOC, while SiN is etched most slowly. In an exemplary processing set-up, 50 W capacitively coupled plasma (CCP) at 60 MHz, under a pressure of about 0.5 Torr, with 50 sccm gas flow, 75 mm electrode gap and 5 W bias at 2 MHz may be used. As explained in more detail below, the processing temperature is adjusted based on the desired etch selectivity.

Figure 4:
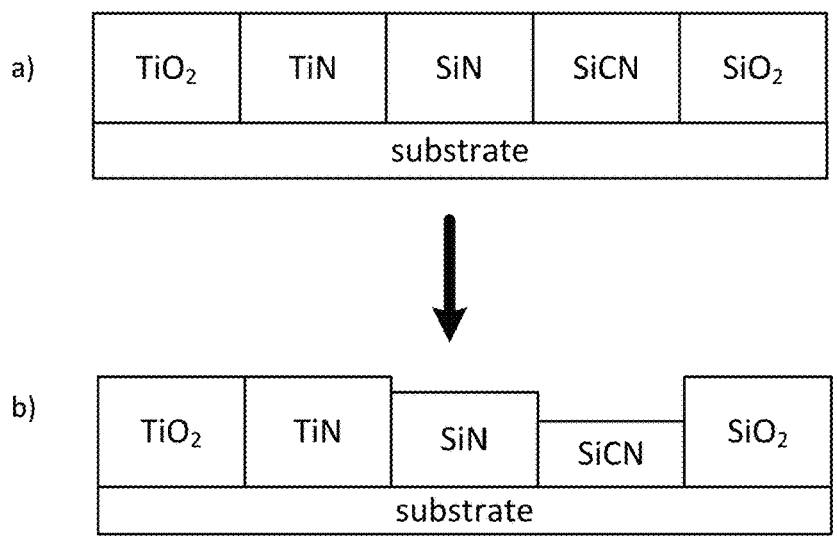
FIG. 4 depicts an exemplary embodiment of a method according to the current disclosure in schematic form.

FIG. 4 presents a process flow for selectively etching silicon-comprising, especially silicon and nitrogen-comprising materials relative to titanium-comprising materials and silicon oxide. Thus, in the embodiment of FIG. 4, the substrate comprises two different etchable materials, namely SiN and SiCN, and three non-etchable materials, namely $TiO_2$, TiN and $SiO_2$. The process is run at a low temperature, for example at a temperature of 30° C. or lower, such as at a temperature of about 20° C. As depicted in b) of FIG. 4, silicon and carbon-comprising material, such as SiCN, is etched faster relative to silicon and nitrogen-comprising materials, such as SiN. Titanium-comprising materials, $TiO_2$, TiN, as well as silicon and oxygen-comprising material, such as $SiO_2$ is not etched.

The etching may be performed, for example, by providing CCP hydrogen plasma (plasma power being 50 W) into the reaction chamber, purging the reaction chamber by vacuum, and then providing fluorine radicals and hydrogen into the reaction chamber. The fluorine radicals may be generated, for example, from $SF_6$ or $NF_3$. Without limiting the current disclosure to any specific theory, providing hydrogen into the reaction chamber simultaneously with reactive halogen species may allow the selective etching according to the current disclosure, since reactive HF species, such as HF·, may be generated in situ in the reaction chamber, and it may have suitably lower reactivity than fluorine radicals, which may be too aggressive for selective applications. The etching may be performed in a cyclic manner, alternating between providing hydrogen plasma in the reaction chamber and providing halogen (i.e. fluorine) radicals in the reaction chamber. Purging may be performed after each of providing hydrogen plasma and providing reactive halogen species. In some embodiments, the etch rate of SiCN may be, for example, between about 0.3 nm/cycle and about 2 nm/cycle, such as about 1 nm/cycle; whereas the etch rate of SiN may be, for example, between about nm/cycle and about 1.5 nm/cycle, such as about 0.5 nm/cycle.

Figure 5:
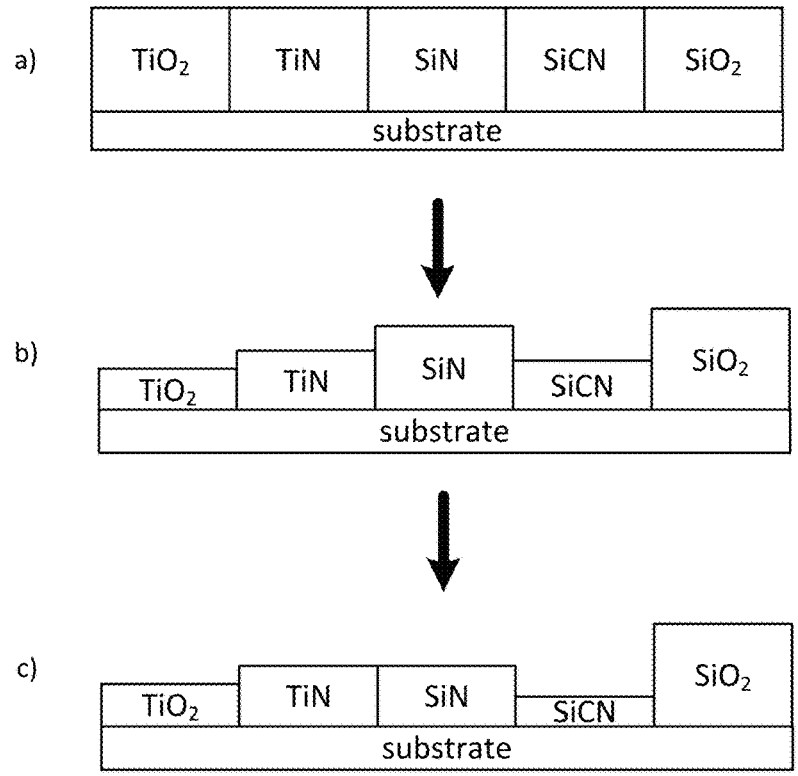
FIG. 5 depicts another exemplary embodiment of a method according to the current disclosure in schematic form.

FIG. 5 depicts another exemplary embodiment of a method according to the current disclosure in schematic form. The process of this embodiment is performed in two different phases. First, phase a) shows the initial situation as described above. The first etching, which may comprise multiple etching cycles, is performed at a higher temperature of about 170° C. or about 180° C. In this temperature, in addition to the silicon-comprising materials SiN and SiCN, also titanium-containing materials $TiO_2$ and TiN are etched. The relative etching speeds between the materials are different: $TiO_2$ is etched faster than TiN. $TiO_2$ may have an etch rate of about 2.5 nm/cycle (or from about 1.5 nm/cycle to about 3.5 nm/cycle) under the tested process conditions, whereas TiN is etched at a rate of about 0.8 nm/cycle (such as from about 0.4 nm/cycle to about 1.5 nm/cycle). Both SiN and SiCN are etched as well, and their etch rates in the higher temperature of 170° C. or 180° C. were about nm/cycle and about 2 nm/cycle respectively. Thus, although not accurately depicted in the drawing, the etch rate of SiCN is slightly lower than that of $TiO_2$. After the situation presented in FIG. 5 b) has been achieved, the process may be continued at a lower temperature as described in the embodiment of FIG. 4. As indicated in FIG. 4, only the silicon and nitrogen-comprising materials continue to be etched. This difference offers flexibility which may be utilized in various alternative processing schemes, depending on the material on the surfaces, their relative thicknesses, and the target topology of the structures and devices being formed. In the embodiment of FIG. 5, the only non-etchable material present on the substrate is $SiO_2$, which is substantially not etched during processing. Each of the stages of the process (high temperature and low temperature) may be performed in a cyclic manner, alternating between providing hydrogen plasma in the reaction chamber and providing halogen (i.e. fluorine) radicals in the reaction chamber.

Figure 6:
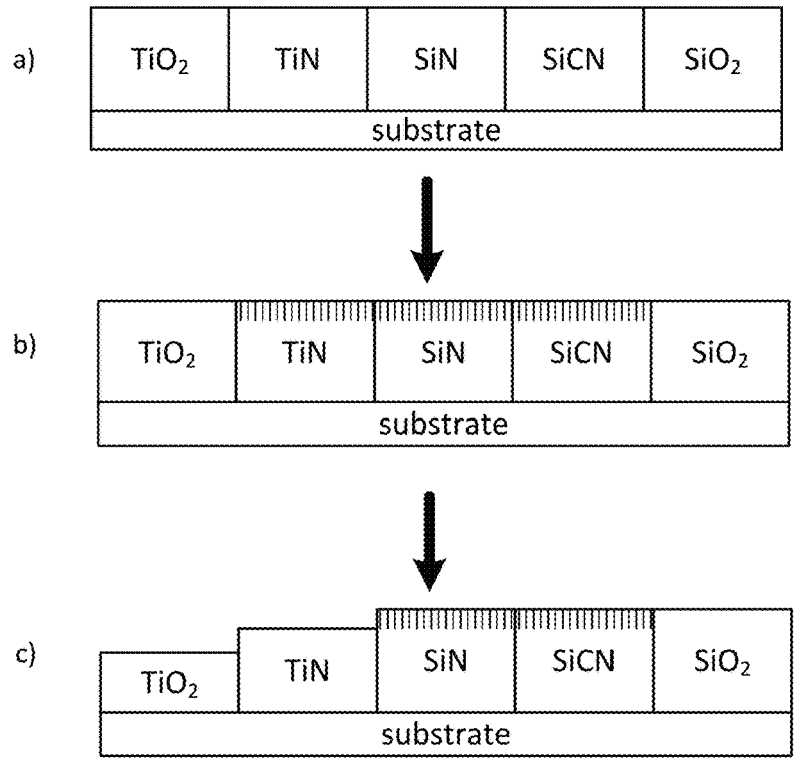
FIG. 6 depicts yet another exemplary embodiment of a method according to the current disclosure in schematic form.

FIG. 6 depicts another exemplary etching process according to the current disclosure. In this embodiment, oxygen plasma is used as an oxidant to modify the surfaces of the materials present on the substrate. The surface of the substrate depicted in phase a) is modified by providing oxygen plasma into the reaction chamber. In some embodiments, the process may comprise a pretreatment with, for example, reactive fluorine species, to remove any native oxide from the surface of the substrate. The temperature of the reaction chamber when providing oxygen plasma may vary according to the application. In some embodiments, the oxygen plasma may be provided to the reaction chamber at a temperature from about 20° C. to about 200° C., such as at a temperature from about 150° C. to about 200° C., or at a temperature from about 150° C. to about 180° C., such as at a temperature of about 170° C. or about 180° C.

Phase b) of FIG. 6 illustrates—in a completely schematic manner—the modification of surfaces by the oxidation. Generally, all other surfaces than metal oxide surfaces— namely TiN, SiN and SiCN—are modified by the oxygen plasma. The effect of the oxidation treatment by oxygen plasma on the materials differs, however. The surfaces of silicon-containing materials are at least partially converted to $SiO_2$, which is a non-etchable material, whereas titanium-containing materials are at least partially converted to titanium oxide, which is an etchable material under high temperatures (such as 170° C. and above). In other words, oxidation may block the etching of silicon-comprising materials, while allowing the etching of titanium-comprising materials to continue. The result is schematically presented in FIG. 6 c).

Figure 7:
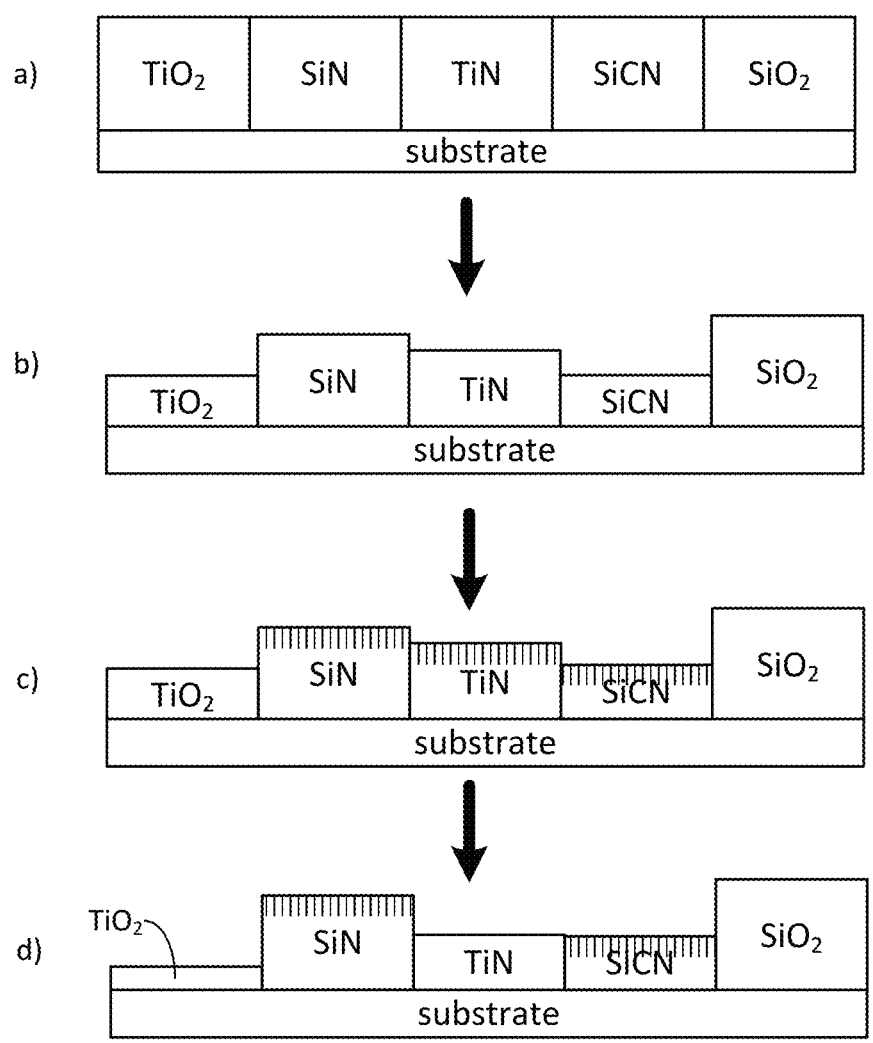
FIG. 7 depicts a further exemplary embodiment of a method according to the current disclosure in schematic form.

FIG. 7 depicts a further exemplary embodiment of a method according to the current disclosure in schematic form. Oxidation treatment may be performed before the cyclic etching process is initiated as described above for the embodiment of FIG. 6, or it may be performed after some amount of etching is performed, to selectively stop the etching of silicon-containing materials, such as SiN or SiCN, as discussed below.

In the beginning of the process, a substrate with different materials is depicted as in the previously described embodiments (phase a)). In phase b), a cyclic etching process etching $TiO_2$, and to a lesser extent TiN, SiN and SiCN, is indicated. Silicon oxide is not etched. This may be a similar etching process as was discussed for FIG. 5. An intermittent oxidation treatment (phase c) halts the etching of silicon-containing materials SiN and SiCN, whereas the etching of TiN and $TiO_2$ continues (phase d)).

Figure 8:
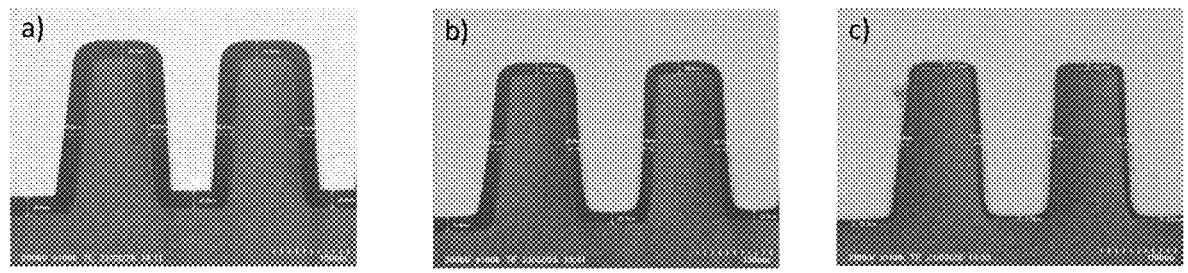
FIG. 8, panels A to C, presents exemplary embodiments of etching performed on 3D structures.
Figure 8:
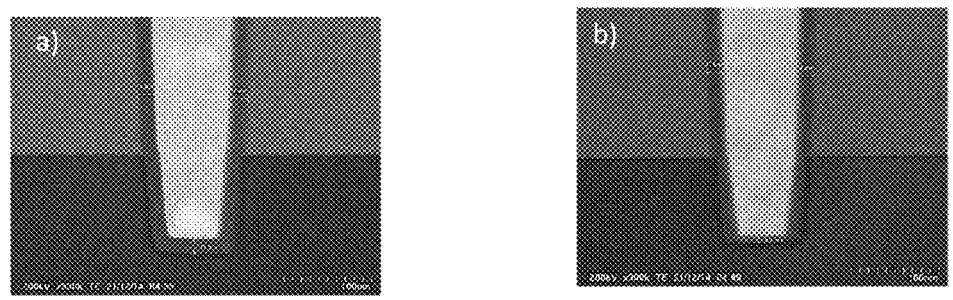
Figure 8:
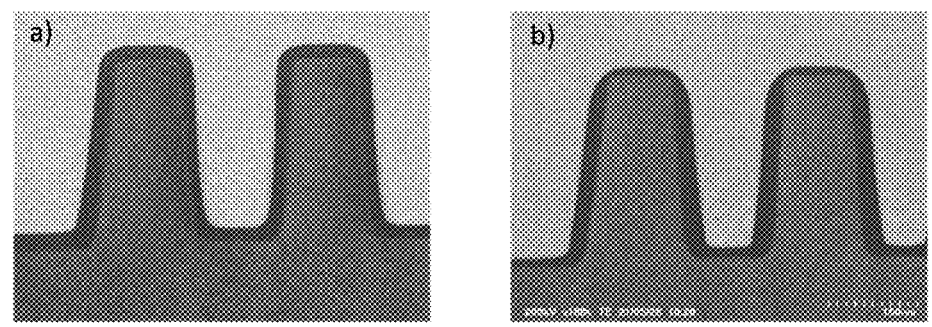

FIG. 8 depicts exemplary embodiments of isotropic (panel A) and anisotropic (panels B and C) modes of the current processes.

In panel A, a $TiO_2$ layer of approximately 40 nm is uniformly deposited on 3D structures present on a silicon surface (electron micrograph a). After 6 cycles of etching, the thickness of the $TiO_2$ coating has been reduced to about 29 nm, whereas after 18 etching cycles, the thickness of the $TiO_2$ layer is about 13 nm. The etching was performed at a temperature of about 180° C. by, in each cycle, first providing hydrogen plasma into the reaction chamber, and then reactive fluorine species and hydrogen into the reaction chamber. The isotropic etching was performed at a pressure of between about 6 and about 9 Pa, with intermittent purge evacuation at a pressure of about 0.1 Pa.

Panel B depicts the etching of a similar $TiO_2$ layer as above. The etching was performed at a temperature of 170° C. at a pressure of 6 Pa. The process comprises providing oxygen plasma into the reaction chamber before providing hydrogen-containing plasma and remotely-generated reactive halogen species into the reaction chamber.

In panel C, SiN has been anisotropically etched by the methods described herein in a structure having gaps with aspect ratio of at least 12.5:1 and a depth of about 2.5 μm. Initially, SiN was substantially uniformly deposited throughout the structure, and the SiN layer had a thickness of about 18 nm. After about 10 cycles of a cyclic etching process according to the current disclosure, the thickness of the SiN layer at bottom of the gap had been reduced to about 8 nm, whereas the thickness of the side wall was substantially unchanged. The process was performed at a room temperature (about 20° C.), and a substrate bias of 10 V. However, the process may be performed at a higher temperature of, at least about 120° C. or about 150° C., or about 120° C. The etching rate may be changed by a temperature change, but the basic selectivity in etching remains the same. An important parameter to use in selecting suitable processing conditions for topo-selective etching are, for example the remote —HF* radical pulse time (the step of providing a fluorine radical and hydrogen into the reaction chamber) and reaction chamber pressure, which should be lower for anisotropic etch processes that for isotropic processes. Additionally, for high aspect ratio structures, the pulse time for the reactive species needs to be longer than for less aggressive structures to give the reactants enough time to reach below of the trench. Further, substrate bias may be adjusted between aggressive a less aggressive structures. Higher bias may be beneficial for H ions to modify the bottom of the gaps or other structures. Similar topo-selective etching schemes may work for other materials, such as for $TiO_2$, TiN and SiCN.

Figure 9:
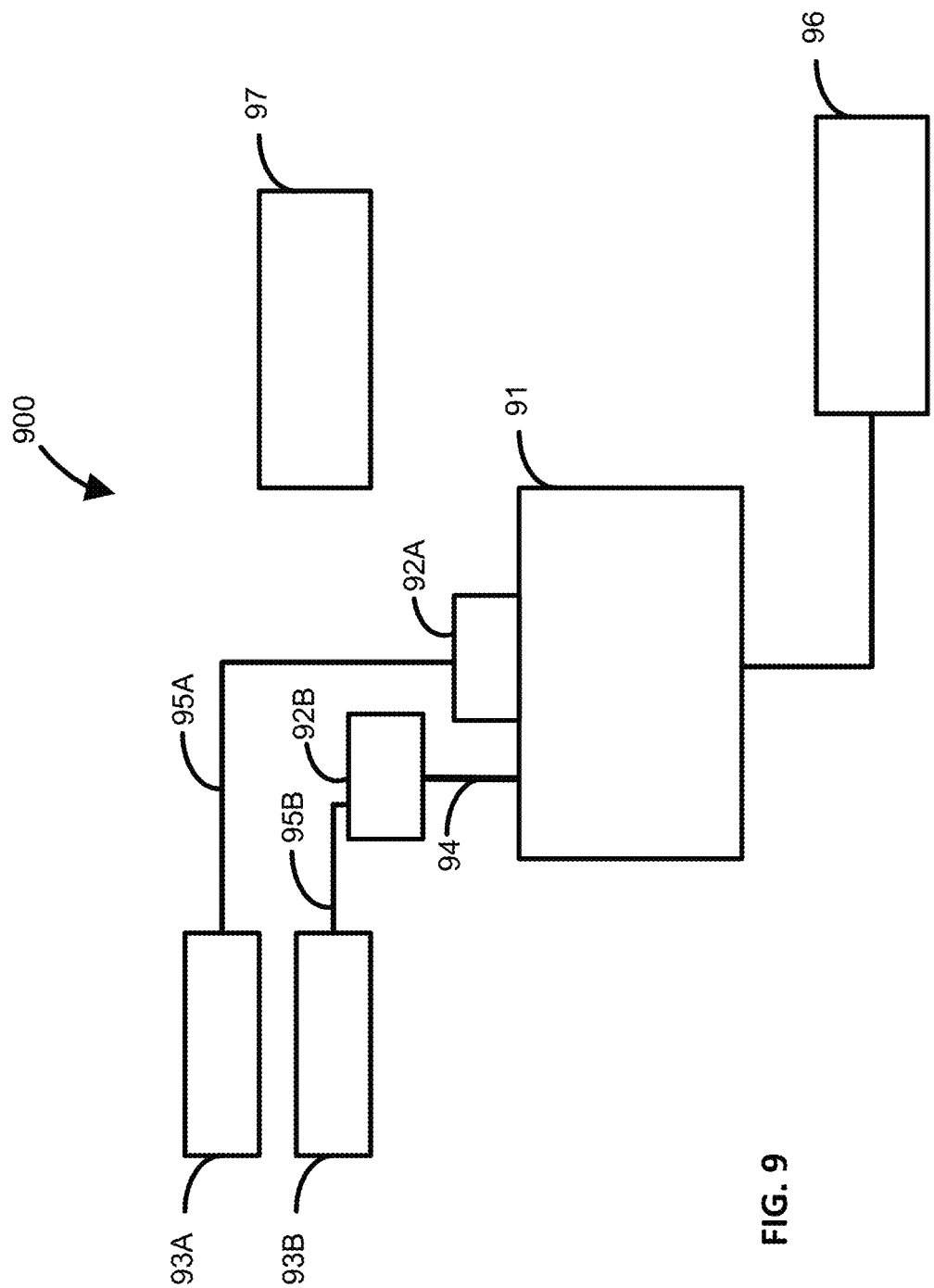
FIG. 9 presents an embodiment of an assembly for processing a substrate according to the current disclosure.

FIG. 9 illustrates an exemplary embodiment of a substrate processing assembly 900 according to the current disclosure in a schematic form. As a schematic representation of a substrate-processing assembly, many components have been omitted for simplicity of illustration, and such components may include, for example, various valves, manifolds, purifiers, heaters, containers, vents, and/or bypasses.

The substrate processing assembly 900 may comprise a reaction chamber 91, a first plasma generator 92A for generating hydrogen plasma, a second plasma generator 92B for generating reactive halogen species, a hydrogen source 93A for providing gaseous hydrogen for generating hydrogen plasma by the first plasma generator 92A, a halogen source 93B for providing a halogen reactant in a gas phase to generate reactive halogen species by the second plasma generator 92B, a pathway 94 disposed between the second plasma generator 92A and the reaction chamber 91, and gas lines 95A and 95B providing a fluid communication path from the sources 93A and 93B with the reaction chamber 91. In the embodiment of FIG. 9, the second plasma generator 92B is a remote plasma unit and the substrate processing assembly 900 comprises two gas sources 93A, 93B. Both gas sources 93A and 93B are connected to the reaction chamber 91 through the first and second plasma generator 92A and 92B, respectively, so they may be considered plasma reactant sources. Depending on the process specifics, the assembly may comprise one or more bypasses so that the sources 93A and/or 93B may provide a gas into the reaction chamber without passing through a plasma generator. The pathway 94 and gas lines 95A and 95B, together with the necessary valves, manifolds, etc., constitute a reactant injection system to provide a hydrogen plasma and reactive halogen species from the plasma generator into the reaction chamber in vapor phase. The substrate processing assembly may further comprise additional gas sources, and corresponding gas lines, valves, etc. to provide purge gases or other process gases into the reaction chamber.

FIG. 9 additionally illustrates an exhaust gas source 96. An exhaust source 96 may comprise one or more vacuum pumps. The embodiment of a substrate processing assembly additionally comprises and a controller 97. The controller 97 includes electronic circuitry and software to selectively operate valves, manifolds, heaters, pumps and other components included in the substrate processing assembly 900. Such circuitry and components operate to provide gases, regulate temperature, pressure etc. to provide proper operation of the substrate processing assembly 900. Controller 97 can include modules such as a software or hardware component, which performs certain tasks. A module may be configured to reside on the addressable storage medium of the control system and be configured to execute one or more processes.

The substrate processing assembly of FIG. 9 may be a part of a cluster tool comprising multiple reaction chambers. The reaction chamber 91 may be an individual processing station of a multi-station tool. In some embodiments, the substrate processing assembly comprises a hot-wall, cold-wall or warm-wall type of reaction chamber.

During operation of substrate processing assembly 900, substrates, such as semiconductor wafers (not illustrated), are transferred from, e.g., a substrate handling system to reaction chamber 91. Once substrate(s) are transferred to reaction chamber 91, one or more gases from gas sources 93A or 93C, such as for generating reactive species and/or purge gases, are introduced into reaction chamber 91.

The exemplary embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of selectively etching material from a first surface of a substrate relative to a second surface of the substrate, the method comprising:
   providing the substrate having a first surface comprising an etchable material, and a second surface comprising a non-etchable material in a reaction chamber;
   providing hydrogen-containing plasma into the reaction chamber to reduce the etchable material to a predetermined depth; and
   providing remotely-generated reactive halogen species and hydrogen into the reaction chamber to selectively etch the reduced etchable material.

2. The method of claim 1, wherein the method is a cyclic etching process.

3. The method of claim 1, wherein the method is a self-limiting process.

4. The method of claim 1, wherein the hydrogen-containing plasma and the reactive halogen species are provided into the reaction chamber alternately and sequentially.

5. The method of claim 1, wherein hydrogen is provided into the reaction chamber simultaneously with the reactive halogen species to generate reactive HF species in the reaction chamber.

6. The method of claim 1, wherein the reaction chamber is purged after providing the hydrogen-containing plasma and/or after providing the reactive halogen species into the reaction chamber.

7. The method of claim 1, wherein the first surface comprises an oxide.

8. The method of claim 7, wherein the oxide is a metal oxide.

9. The method of claim 8, wherein the metal oxide is a transition metal oxide.

10. The method of claim 1, wherein the second surface comprises a nitride.

11. The method of claim 10, wherein the second surface comprises a metal nitride.

12. The method of claim 1, wherein the second surface comprises silicon.

13. The method of claim 1, wherein the second surface does not comprise oxygen.

14. The method of claim 12, wherein the second surface comprises a material selected from a group consisting of silicon oxide and silicon nitride.

15. The method of claim 1, wherein the etchable material comprises a material selected from a group comprising of titanium oxide, titanium nitride, silicon carbonitride and silicon nitride.

16. The method of claim 12, wherein the second surface comprises a material comprising silicon oxide.

17. The method of claim 1, wherein the method further comprises providing an oxidant into the reaction chamber before providing the hydrogen-containing plasma into the reaction chamber.

18. The method of claim 17, wherein the oxidant comprises oxygen-containing plasma.

19. The method of any of claim 1, wherein the substrate has a third surface comprising a third material, and the hydrogen-containing plasma reduces the third material to a different depth relative to the first surface and the second surface.

20. The method of claim 19, wherein the third material is selected from a group consisting of oxides, nitrides, carbides, oxycarbides and carbonitrides.

21. The method of claim 19, wherein the substrate comprises a fourth or a further surface comprising a fourth or a further material.

22. The method of claim 1, wherein the method is performed at a temperature of about 200° C. or below.

* * * * *